United States Patent [19]

Honda et al.

[11] Patent Number: 5,724,233
[45] Date of Patent: Mar. 3, 1998

[54] SEMICONDUCTOR DEVICE HAVING FIRST AND SECOND SEMICONDUCTOR CHIPS WITH A GAP THEREBETWEEN, A DIE STAGE IN THE GAP AND ASSOCIATED LEAD FRAMES DISPOSED IN A PACKAGE, THE LEAD FRAMES PROVIDING ELECTRICAL CONNECTIONS FROM THE CHIPS TO AN EXTERIOR OF THE PACKAG

[75] Inventors: Tosiyuki Honda, Kawasaki; Takao Haranosono, Satsuma-gun, both of Japan

[73] Assignees: Fujitsu Limited, Kawasaki; Kyushu Fujitsu Electronics Limited, Satsuma-gun, both of Japan

[21] Appl. No.: 647,788

[22] Filed: May 15, 1996

Related U.S. Application Data

[62] Division of Ser. No. 459,689, Jun. 2, 1995, Pat. No. 5,579,208, which is a division of Ser. No. 214,318, Mar. 17, 1994, Pat. No. 5,471,369.

[30] Foreign Application Priority Data

Jul. 9, 1993 [JP] Japan .................................. 5-170540

[51] Int. Cl.$^6$ .............................. H01L 23/485; H05K 1/14
[52] U.S. Cl. ........................... 361/813; 257/676; 257/668; 257/735
[58] Field of Search ...................... 174/52.1, 52.4; 257/676, 667, 678, 668, 723, 724, 777, 725, 735; 361/813; 437/209; 439/68

[56] References Cited

U.S. PATENT DOCUMENTS 5,331,235  7/1994  Chon ................................ 257/777
5,479,051  12/1995 Waki et al. ........................ 257/724
5,530,292  6/1996  Waki et al. ........................ 257/777

FOREIGN PATENT DOCUMENTS

| 4214102 | 12/1992 | Germany | 257/723 |
| 56-062351 | 5/1981 | Japan | 257/777 |
| 1-303730 | 12/1989 | Japan | 257/777 |
| 2-156662 | 6/1990 | Japan | 257/777 |
| 4-184949 | 7/1992 | Japan | 437/211 |
| 5-109976 | 4/1993 | Japan | 257/723 |
| 5-109978 | 4/1993 | Japan | 257/723 |
| 5-315540 | 11/1993 | Japan | 257/723 |

*Primary Examiner*—Donald Sparks
*Attorney, Agent, or Firm*—Staas & Halsey

[57] ABSTRACT

A chip-on chip type semiconductor device is provided in which semiconductor chips provided in a package cannot be displaced during a transfer molding process so as to eliminate a short circuit. At least two lead frames are provided in and extend from the package so that the first semiconductor chip and the second semiconductor chip can be electrically connected to external devices. A die stage is provided between the first semiconductor chip and the second semiconductor chip. A bonding wire is provided for wiring between the first semiconductor chip and the lead frames, and TAB leads connect the second semiconductor chip to the lead frames. The lead frames may extend between the first and second semiconductor devices instead of the die stage. The lead frames may include one having a portion extending in a direction perpendicular to the longitudinal direction of the lead frames between the first and second semiconductor chips.

7 Claims, 16 Drawing Sheets

5,724,233

SEMICONDUCTOR DEVICE HAVING FIRST AND SECOND SEMICONDUCTOR CHIPS WITH A GAP THEREBETWEEN, A DIE STAGE IN THE GAP AND ASSOCIATED LEAD FRAMES DISPOSED IN A PACKAGE, THE LEAD FRAMES PROVIDING ELECTRICAL CONNECTIONS FROM THE CHIPS TO AN EXTERIOR OF THE PACKAG

This application is a division of application Ser. No. 08/459,689 filed Jun. 2, 1995 now U.S. Pat. No. 5,579,208, in turn a division of Ser. No. 08/214,318, filed Mar. 17, 1994, now U.S. Pat. No. 5,471,369, issued Nov. 28, 1995.

BACKGROUND OF THE INVENTION

1. Field of the Invention

The present invention generally relates to semiconductor devices, and more particularly to a semiconductor device having a plurality of semiconductor chips within a package thereof.

2. Description of the Prior Art

Recently, a highly integrated chip-on-chip type semiconductor device which has a plurality of semiconductor chips provided in a single package has been used so as to satisfy the requirement of downsizing for electronic equipments. In order to reduce a semiconductor chip in its weight and size, it is required to have a thinner package.

FIG. 1 is a cross sectional view of an example of a conventional chip-on-chip type semiconductor device. A conventional semiconductor device 11 comprises semiconductor chip 14a mounted on an upper surface of a die stage 12 with an adhesive 13a. A semiconductor chip 14b is mounted on a bottom surface of the die stage 12 with an adhesive 13b. The semiconductor chip 14b is mounted upside down relative to the semiconductor chip 14a. The semiconductor chip 14a is electrically connected to lead frames 16a and 16b by bonding wires 15a and 15b, respectively so that the semiconductor chip 14a can be electrically connected to external devices. Similarly, the semiconductor chip 14b is electrically connected to lead frames 16a and 16b by bonding wires 15c and 15d, respectively so that the semiconductor chip 14b can be electrically connected to external devices.

FIG. 2 is a cross sectional view of another example of a conventional chip-on-chip type semiconductor device. As shown in FIG. 2, a conventional semiconductor device 1 comprises two semiconductor chips 3a and 3b. The semiconductor chips a and 3b are positioned in a center opening section of a lead frame 2. The respective surfaces of semiconductor chips 3a and 3b, which are provided with circuitry, are directed upward. The semiconductor chip 3a is attached to an end of each of TAB (Tape Automated Bonding) leads 5a and 5b which are bent as shown in FIG. 2, by means of inner lead bonding. The semiconductor chip 3b is connected to an end of each of TAB leads 5c and 5d by means of inner lead bonding. The TAB leads 5a and 5b are bent so that a predetermined space is formed between the bottom surface 3a" of the semiconductor chip 3a and the top surface 3b' of the semiconductor chip 3b.

The other end of each of the TAB leads 5a, 5b, 5c and 5d is connected to the respective outer lead 6 of the lead frame 2 by means of outer lead bonding. The semiconductor chips 3a and 3b are packaged using molding resin 7 by means of transfer molding. The outer lead 6 is bent, for example, in an L or J shape so that the packaged semiconductor device 1 can be surface mounted on a circuit board (not shown in the figure).

FIGS. 3A and 3B are views showing another example of a conventional chip-on-chip type semiconductor device; FIG. 3A is a cross sectional view taken along a line X–X' of FIG. 3B; FIG. 3B is a plan view.

A semiconductor device 21 shown in FIG. 3A comprises semiconductor chips 22a and 22b connected to the respective TAB leads 23a, 23b and 23c, 23d by means of inner lead bonding. The semiconductor chip 22a is supported by TAB leads 23a and 23b, and the semiconductor chip 22b is supported by TAB leads 23c and 23d. The semiconductor chip 22a is connected to lead frames 24a and 24b via the TAB leads 23a and 23b, respectively, and the semiconductor chip 22b is connected to lead frames 24a and 24b via the TAB leads 23c and 23d respectively. The semiconductor chip 22a is positioned upside down relative to the semiconductor chip 22b. Accordingly, the semiconductor chips 22a and 22b can be electrically connected to external devices. It should be noted that each of TAB leads 23a, 23b, 23c and 23d is bent as shown in FIG. 3A so that a space is formed between the semiconductor chip 22a and the semiconductor chip 22b.

FIG. 4 is a cross sectional view of another example of a conventional chip-on-chip type semiconductor device. A semiconductor device 31 shown in FIG. 4 comprises two semiconductor chips 32a and 32b, the semiconductor chip 32a being upside down relative to the semiconductor chip 32a. The semiconductor chip 32a is supported by TAB leads 33a and 33b, and the semiconductor chip 32b is supported by TAB leads 33c and 33d. The semiconductor chips 32a and 32b are connected to a lead frame 34a via the respective TAB leads 33a and 33c, and connected to a lead frame 34b via the respective TAB leads 33b and 33d. Accordingly, the semiconductor chips 32a and 32b can be electrically connected to external devices via the lead frames 34a and 34b. It should be noted that each of the TAB leads 33a, 33b, 33c and 33d is straight as shown in FIG. 4

In the above-mentioned conventional semiconductor devices, there are problems described below.

In a manufacturing process of the semiconductor device 11 shown in FIG. 1, the semiconductor chip 14a is attached first to the die stage 12. After that, the die stage 12 is reversed so that the semiconductor chip 14a is positioned underneath the die stage 12 in order to mount the semiconductor chip 14b on the reverse surface of the die stage 12. When mounting the semiconductor chip 14b, the semiconductor chip 14b is required to be pressed by a die via the surface of the semiconductor chip 14b as shown in FIG. 5.

In order to prevent the die stage from moving when the semiconductor chip 14b is pressed, the die stage 12 is fixed to a die table 18, and the semiconductor chip 14a is supported by the die table 18. There is a problem in that the surface of the semiconductor chip 14a may be damaged when the semiconductor chip 14a makes contact with the surface of the die table 18.

Additionally, if the semiconductor chip 14b is mounted on the die stage 12 after the semiconductor chip 14a is wire bonded, there may be a problem in that a bonding wire is bent or deformed by the reason the same as above.

In the case of the semiconductor device 1 of FIG. 2 and the semiconductor device 21 of FIG. 3A and 3B, two semiconductor chips are attached to the TAB leads on either side. Accordingly, semiconductor chips are supported only by the TAB leads before they are packaged, and thus the semiconductor chips tend to be displaced when a transfer molding process is applied.

A description will now be given, with reference to FIGS. 6A and 6B, of the transfer molding process of the semiconductor device 1 as an example.

As shown in FIG. 6A, the lead frame 2 and the semiconductor chips 3a and 3b are placed inside a cavity 9 formed between an upper mold 8a and a lower mold 8b after the semiconductor chips 3a and 3b are attached to the lead frame 2 via the respective TAB leads 5a, 5b, 5c and 5d. The transfer molding is performed by injecting an amount of melted molding resin into the cavity 9 via a gate 10. At the initial stage of injection, as shown in FIG. 6A, little force is applied to the semiconductor chips 3a and 3b, and thus the semiconductor chips 3a and 3b stay in the respective predetermined supported positions.

However, as the molding resin progresses to the far end of the semiconductor chips 3a and 3b from the gate 10, forces in various directions are applied to the semiconductor chips 3a and 3b due to the flow of the viscous molding resin. Since the semiconductor chip 3a is supported only by the TAB leads 5a and 5b which are made of thin films having a low rigidity and since they are bent, as shown in the figure, the TAB leads may be deformed by the forces applied to the semiconductor chip 3a by the resin flow. The TAB leads 5a and 5b are formed of, for example, a polyimide film having a thickness of 125 μm with a copper pattern film having a thickness of 35 μm adhering thereto. Accordingly, the semiconductor chip 3a may be displaced and the TAB leads 5a and 5b may be deformed, due to the flow of the molding resin.

Although the semiconductor chip 3b is supported by the TAB leads 5c and 5d which are not bent like TAB leads 5a and 5b, the semiconductor chip 3b may be displaced slightly because the TAB leads 5c and 5d are formed of the same materials having a low rigidity as that of the TAB leads 5a and 5b.

In order to eliminate the above-mentioned problem caused by the flow of the molding resin, various molding methods are suggested in which the viscosity of the molding resin is changed or the position of the gate 10 is changed so that the flow of the molding resin does not affect the position of the semiconductor chips 3a and 3b. However, even if the injection conditions are appropriately controlled, the semiconductor chips 3a and 3b may be displaced due to variability of manufacturing accuracy of the TAB leads.

If the semiconductor chips 3a and 3b are displaced and the TAB leads are accordingly deformed, the TAB lead 5d may be in contact with the surface 3a' of the semiconductor chip 3a or the TAB lead 5a may be in contact with an upper edge of the semiconductor chip 3a, which conditions result in a short circuit in the semiconductor device. This is a problem common, as well, to the semiconductor devices 21 and 31 of the preceeding FIGS. 3A to 4.

Additionally, there are two other problems in the semiconductor device 21 shown in FIG. 3A. One problem is, as described below, that one of the semiconductor chips 22a and 22b must be mirror symmetric to the other one. The other problem is, as described below, that the wiring to a chip selector pad is complex when the semiconductor chips are wired so that each of the semiconductor chips performs a different operation.

As shown in FIG. 3A, the TAB lead 23b connected to the pad 25a of the semiconductor chip 22a and the TAB lead 23d connected to the pad 25b of the semiconductor chip 22b are both connected to the same lead frame 24b. Accordingly, the pad 25a of the semiconductor chip 22a and the pad 25b of the semiconductor chip 22b must be pads having the same electrical function. Therefore, the semiconductor chips 22a and 22b must be mirror symmetric to each other with respect to the pads provided on the surfaces of the semiconductor chips 22a and 22b. Due to the above, it is difficult to provide the same two semiconductor chips, that is semiconductor chips having the same pad construction, in a single package.

Additionally, in the existing semiconductor chip technology, independent voltage signals are individually supplied to the semiconductor chips 22a and 22b so that the semiconductor chips 22a and 22b perform different operations. Therefore, as shown in a semiconductor device 21a of FIGS. 7A and 7B, a TAB lead 30 must be extended as indicated by dashed lines in the figures. FIG. 7A is a cross sectional view of the semiconductor device 21a taken along a line 7A—7A in FIG. 7B FIG. 7B is a plan view of a portion of the semiconductor device 21a. The TAB lead 30 is extended from a pad 27 to a lead frame 29 which not is located in the position nearest to the pad 27 while TAB lead 23a is connected to the lead frame 28 in a position nearest to the pad 26. If the lead frames 28 and 29 are located adjacent to each other, the TAB lead 30 can be extended to the lead frame 29. However, if the lead frame 29 is provided in a position distant from the lead frame 28, it is difficult to extend the TAB lead 30 to the distant lead frame 29. That is, there is a problem, in such a case, that the wiring to the chip select pad cannot be performed.

SUMMARY OF THE INVENTION

It is a general object of the present invention to provide a semiconductor device in which the above-mentioned disadvantages are eliminated.

A more specific object of the present invention is to provide a semiconductor device in which semiconductor chips provided in a package cannot be displaced during a transfer molding process, thereby to eliminate a short circuit due to contact of the semiconductor chips with a bonding wire or a TAB lead connecting the semiconductor chips to a lead frame.

Another object of the present invention is to provide a semiconductor device having at least one pair of semiconductor chips therein, in which semiconductor device identical semiconductor chips can be used as the semiconductor chips of the pair.

Another object of the present invention is to provide a semiconductor device in which a lead frame connected to a predetermined pad provided on a semiconductor chip can be extended from a desired position of a package.

In order to achieve the above-mentioned objects, there is provided, according to the present invention, a semiconductor device comprising:

a package having at least a first semiconductor chip and a second semiconductor chip, the first semiconductor chip being positioned above the second semiconductor chip;

at least two lead frames provided in and extending from the package so that the first semiconductor chip and the second semiconductor chip can be electrically connected to external devices;

a die stage provided between the first semiconductor chip and the second semiconductor chip;

a bonding wire provided for wiring between the first semiconductor chip and the lead frames; and TAB leads connecting the second semiconductor chip to the lead frames.

There is further provided, according to the present invention, a semiconductor device comprising:

a package having at least a first semiconductor chip and a second semiconductor chip, the first semiconductor chip being positioned above the second semiconductor chip;

at least two lead frames provided in and extending from the package so that the first semiconductor chip and the second semiconductor chip can be electrically connected to external devices;

a die stage provided between the first semiconductor chip and the second semiconductor chip;

at least one first TAB lead connecting the first semiconductor chip to a corresponding one of the lead frames; and at least one second TAB lead connecting the second semiconductor chip to a corresponding one of the lead frames.

There is yet further; provided, according to the present invention, a semiconductor device comprising:

a package having at least a first semiconductor chip and a second semiconductor chip, the first semiconductor chip being positioned above the second semiconductor chip;

at least a first lead frame and a second lead frame provided between the first and second semiconductor chips and extending from the package so that the first semiconductor chip and the second semiconductor chip can be electrically connected to external devices, the first lead frame extending from a first side of the first and second semiconductor chips to a second side, opposite to the first side of the first and second semiconductor chips, the second lead frame extending from the second side to the first side;

at least one first connecting member provided for connecting the first semiconductor chip to the first and second lead frames; and at least one second connecting member provided for connecting the second semiconductor chip to the first and second lead frames.

There is still further; provided, according to the present invention, a semiconductor device comprising:

a package having at least a first semiconductor chip and a second semiconductor chip, the first semiconductor chip being positioned above the second semiconductor chip;

at least a first lead frame, a second lead frame and a third lead frame provided between the first and second semiconductor chips and extending from the package so that the first semiconductor chip and the second semiconductor chip can be electrically connected to external devices, the first lead frame extending a predetermined length from a first side of the first and second semiconductor chips, the second lead frame extending from a second side, opposite to the first side, of the first and second semiconductor chips, a space being formed between an end of the first lead frame and an end of the second lead frame and between the first semiconductor chip and the second semiconductor chip, the third lead frame having a portion extending, in the space, in a direction perpendicular to the longitudinal direction of the first and second lead frames;

at least one first TAB lead connecting the first semiconductor chip to a corresponding one of the first and third lead frames; and at least one second TAB lead connecting the second semiconductor chip to a corresponding one of the second and third lead frames.

Other objects, features and advantages of the present invention will become more apparent by the following detailed description when read in conjunction with the accompanying drawings.

BRIEF DESCRIPTION OF THE DRAWINGS

FIGS. 3A and 3B are views showing another example of a conventional chip-on-chip type semiconductor device, in which FIG. 3A is a cross sectional view taken along a line 3A—3A in FIG. 3B and FIG. 3B is a plan view of a part of the semiconductor device shown in FIG. 3A;

FIG. 7A and 7B are views showing another example of a conventional chip-on-chip type semiconductor device, in which FIG. 7A is a cross sectional view taken along a line 7A—7A in FIG. 7B and FIG. 7B is a plan view of a part of the semiconductor device shown in FIG. 7A;

FIGS. 12A and 12B are views showing another variation of the first embodiment shown in FIG. 8, in which FIG. 12A is a cross sectional view taken along a line 12A—12A in FIG. 12B and FIG. 12B is a plan view of a part of the semiconductor device shown in FIG. 12A;

FIGS. 15A and 15B are views showing a second embodiment of a semiconductor device according to the present invention, in which FIG. 15A is a cross sectional view taken along a line 15A—15A in FIG. 15B and FIG. 15B is a plan view of a part of the semiconductor device shown in FIG. 15A;

FIGS. 17A and 17B are views showing another variation of the second embodiment shown in FIG. 15A, in which FIG. 17A is a cross sectional view taken along a line 17A—17A in FIG. 17B and FIG. 17B is a plan view of a part of the semiconductor device shown in FIG. 17A;

FIGS. 18A and 18B are views showing another variation of the second embodiment shown in FIG. 15A, in which FIG. 18A is a cross sectional view taken along a line 18A—18A in FIG. 18B and FIG. 18B is a plan view of a part of the semiconductor device shown in FIG. 18A;

FIGS. 19A and 19B are views showing a third embodiment of a semiconductor device according to the present invention, in which FIG. 19A is a cross sectional view taken along a line 19A—19A in FIG. 19B and FIG. 19B is a plan view of a part of the semiconductor device shown in FIG. 19A;

FIGS. 22A and 22B are views showing another variation of the third embodiment shown in FIG. 19A, in which FIG. 22A is a cross sectional view taken along a line 22A—22A in FIG. 22B and FIG. 22B is a plan view of a part of the semiconductor device shown in FIG. 22A;

FIGS. 23A and 23B are views showing a fourth embodiment of a semiconductor device according to the present invention, in which FIG. 23A is a cross sectional view taken along a line 23A—23A in FIG. 23B and FIG. 23B is a plan view of a part of the semiconductor device shown in FIG. 23A; and FIGS. 24A and 24B are views showing a variation of the fourth embodiment shown in FIG. 23A, in which FIG. 24A is a cross sectional view taken along a line 24A—24A in FIG. 24B and FIG. 24B is a plan view of a part of the semiconductor device shown in FIG. 24A.

DETAILED DESCRIPTION OF THE PREFERRED EMBODIMENTS

Figure 8:
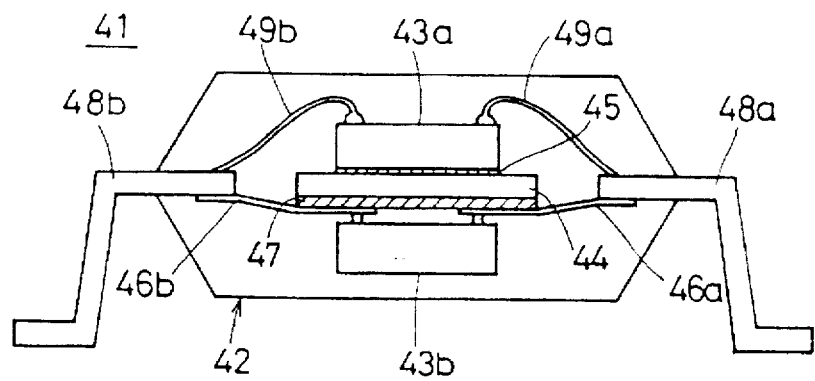
FIG. 8 is a cross sectional view of a first embodiment of a semiconductor device according to the present invention.

A description will now be given, with reference to FIG. 8, of a first embodiment of a semiconductor device according to the present invention. FIG. 8 is a cross sectional view of the first embodiment of a semiconductor device according to the present invention.

The semiconductor device 41 of the first embodiment according to the present invention comprises two semiconductor chips 43a and 43b within a single package 42. The semiconductor chip 43a is mounted on an upper surface of a die stage 44 with an adhesive 45. The surface on which circuitry is provided is directed upwardly. The semiconductor chip 43b is positioned underneath the die stage 44 with its surface on which circuitry is provided directed upwardly. An insulating member 47 is placed between the semiconductor chip 43b and the die stage 44.

The semiconductor chip 43a is electrically connected to lead frames 48a and 48b via bonding wires 49a and 49b, respectively, so that the semiconductor chip 43a can be electrically connected to external devices. The semiconductor chip 43b is electrically connected to lead frames 48a and 48b via TAB leads 46a and 46b, respectively, so that the semiconductor chip 43b can be electrically connected to external devices.

A description will now be given, with reference to FIG. 9, of a manufacturing process of the semiconductor device 41.

The insulating member 47 is first attached to the die stage 44. The die stage 44 is then placed on a die table 50 with the insulating member 47 being positioned between the die table 50 and the die stage 44. After that, the semiconductor chip 43a is mounted on the die stage 44 with an adhesive 45, and then the semiconductor chip 43a is connected to the lead frames 48a and 48b by the bonding wires 49a and 49b, respectively by means of wire bonding.

On the other hand, the semiconductor chip 43b is attached to a TAB tape 51 by means of inner lead bonding. Unnecessary parts of the TAB tape 51 are then cut off at positions indicated by dotted lines in the figure, and thereby the semiconductor chip 43b provided with the TAB leads 46a and 46b is prepared.

Figure 1:
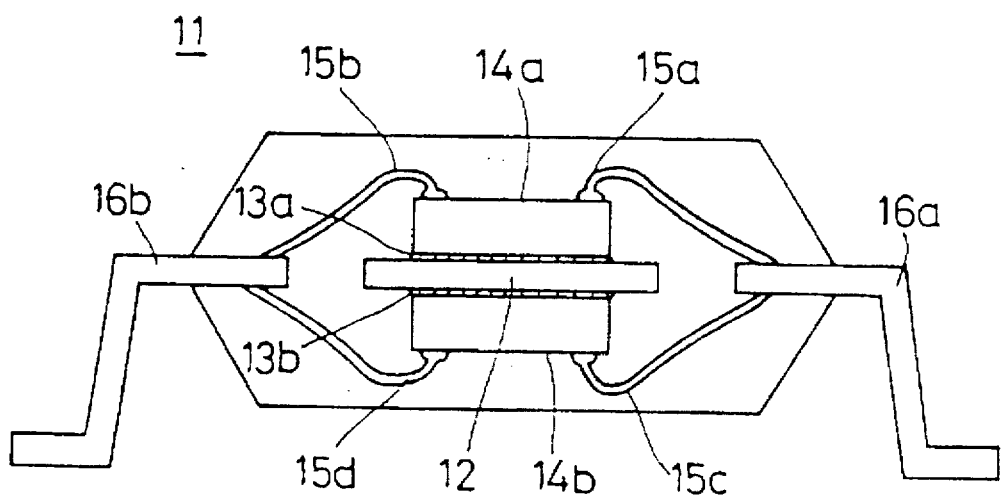
FIG. 1 is a cross sectional view of an example of a conventional chip-on-chip type semiconductor device.
Figure 2:
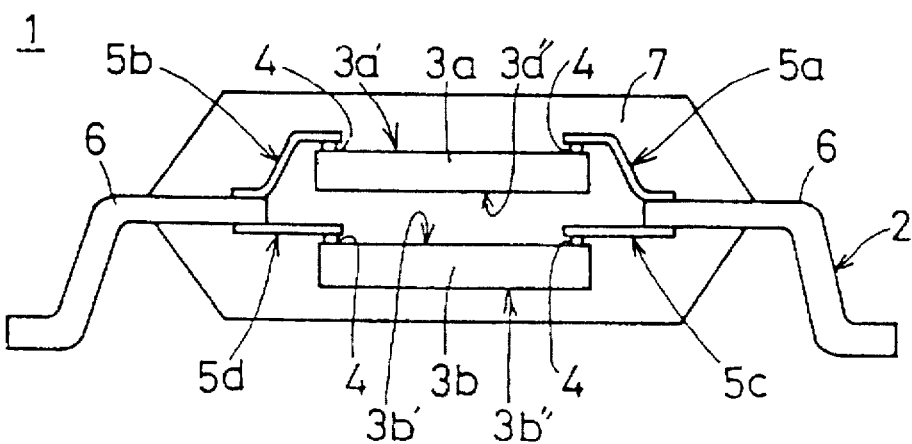
FIG. 2 is a cross sectional view of another example of a conventional chip-on-chip type semiconductor device.
Figure 3A:
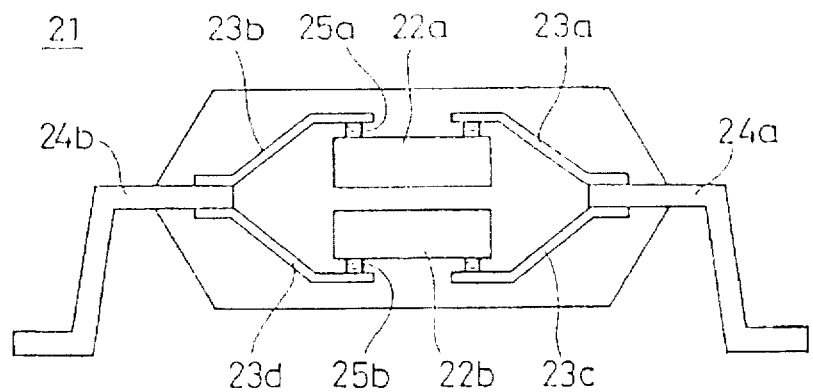
Figure 3B:
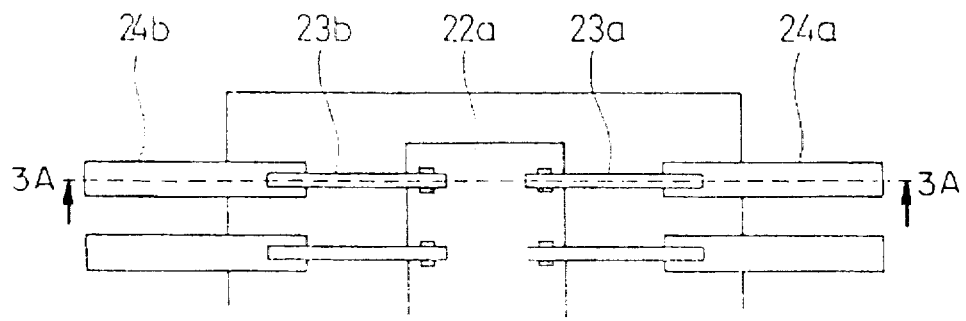
Figure 4:
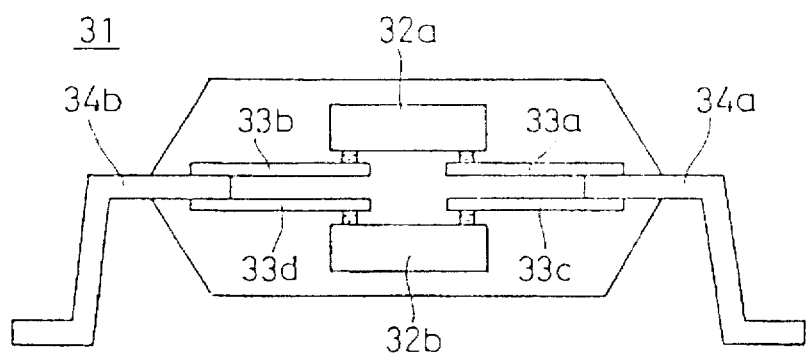
FIG. 4 is a cross sectional view of another example of a conventional chip-on-chip type semiconductor device.
Figure 5:
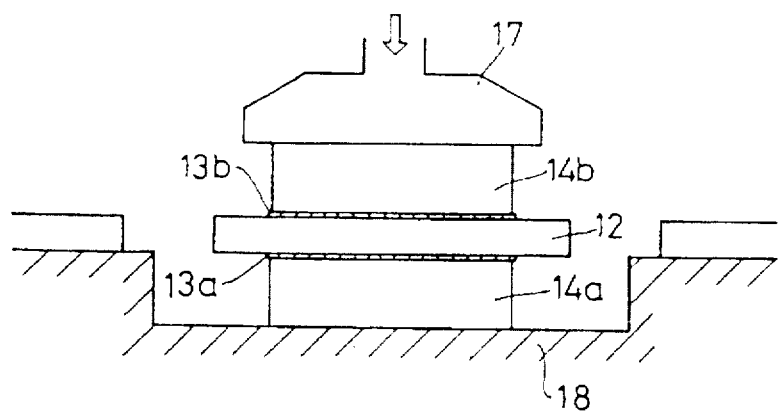
FIG. 5 is a view showing a manufacturing process of the semiconductor device shown in FIG. 1.
Figure 6A:
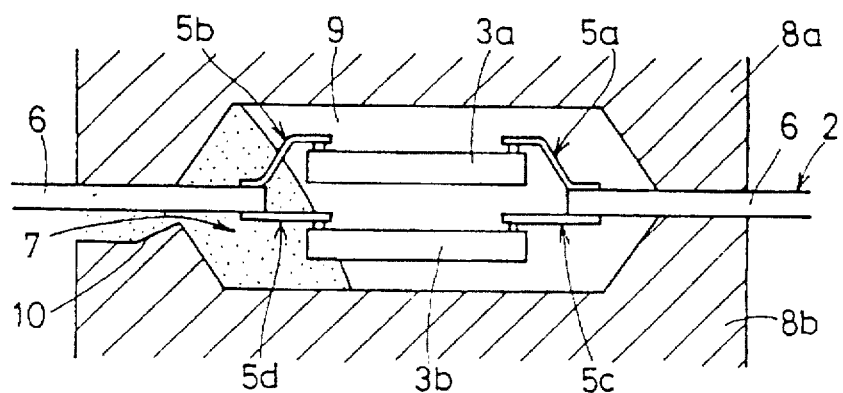
FIGS. 6A and 6B are views showing a transfer molding process of the semiconductor device shown in FIG. 2.
Figure 6B:
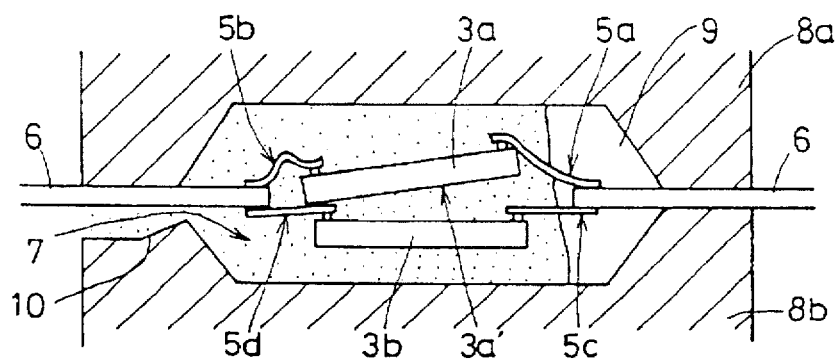
Figure 7A:
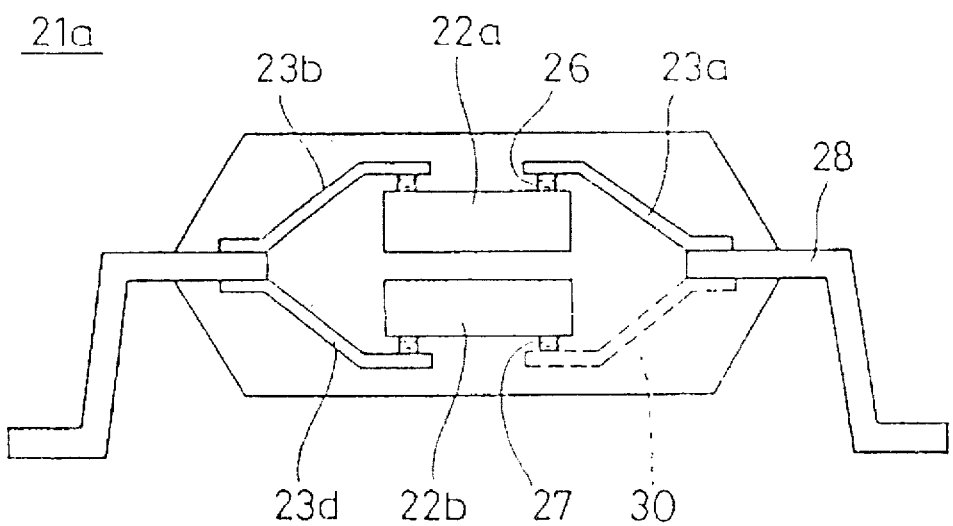
Figure 7B:
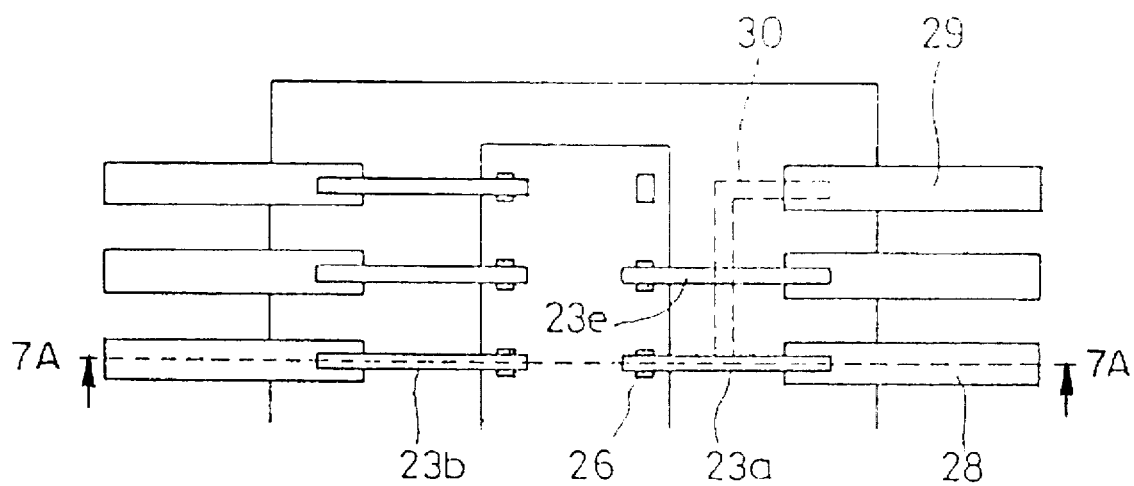
Figure 9:
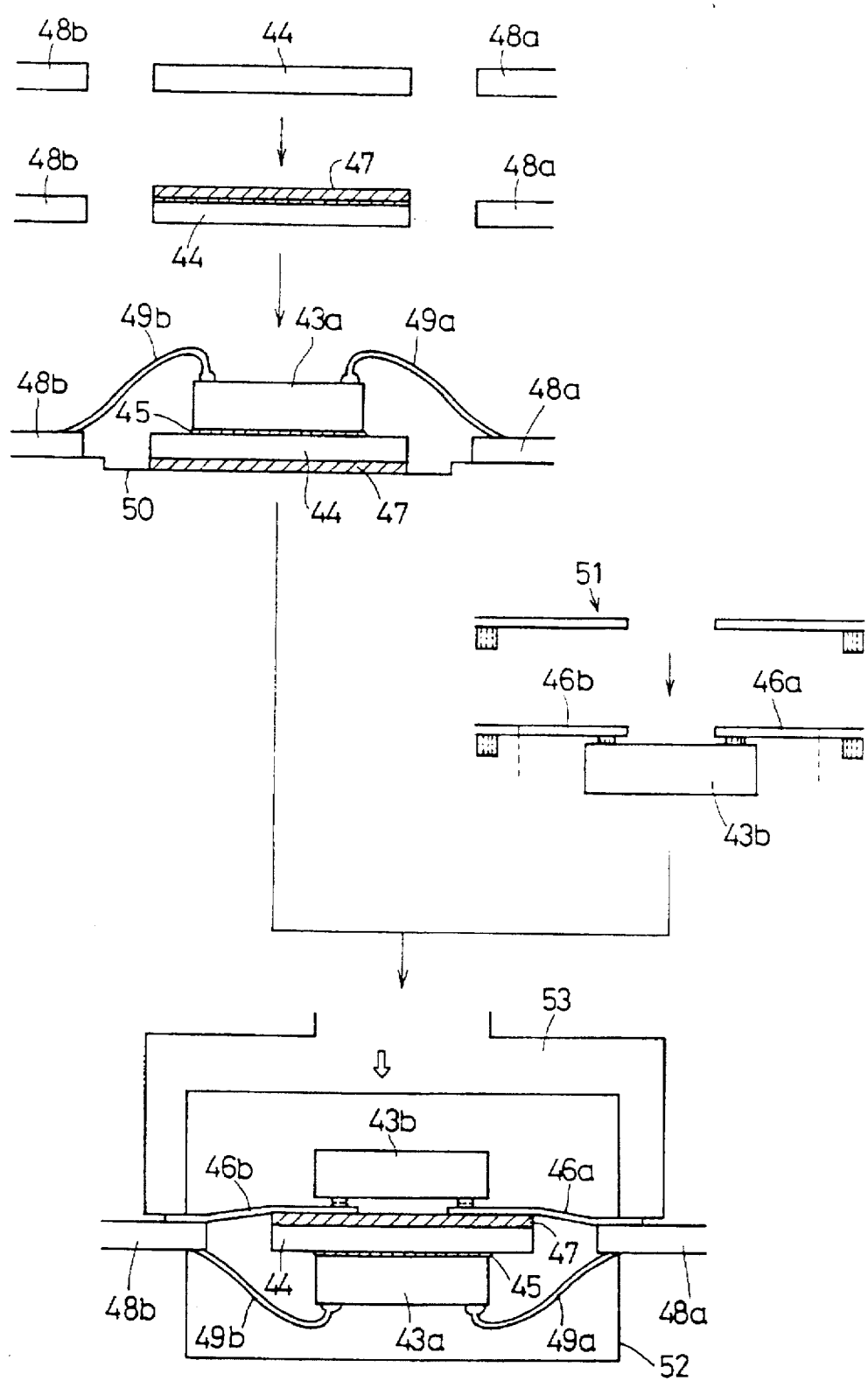
FIG. 9 is an illustration showing a manufacturing process of the semiconductor device of FIG. 8.

After the above processes are completed, the lead frames 48a and 48b are placed on an outer lead bonding table 52 so that the semiconductor chip 43a is placed in a cavity of the outer lead bonding table 52 and the insulating member 47 faces upwardly as shown in FIG. 9. The semiconductor chip 43b is then placed on the insulating member 47 with the TAB leads 46a and 46b positioned between the semiconductor chip 43b and the insulating member 47 and so that the respective end portions of the TAB leads 46a and 46b are positioned on the lead frames 48a and 48b, respectively. The end portions of the TAB leads 46a and 46b are attached to the respective lead frames 48a and 48b by means of outer lead bonding, by pressing the end portions of the TAB leads 46a and 46b using an outer lead bonding tool 53.

It should be noted that if the insulating member 47 is made of a soft material, such as an adhesive, which can be easily deformed, it may be difficult to maintain a sufficient distance between the die stage and the TAB leads 46a and 46b due to the deformation of the insulating member.

Figure 10:
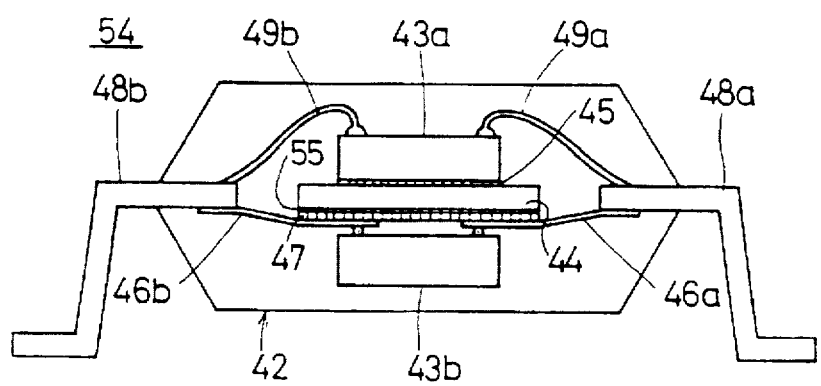
FIG. 10 is a cross sectional view of a variation of the first embodiment shown in FIG. 8.

In order to eliminate the above-mentioned problem, the insulating member 47 may be made of an insulating film and such that the insulating film adheres to the die stage 44 as shown in FIG. 10. FIG. 10 is a cross sectional view of a variation of the first embodiment shown in FIG. 8. In a semiconductor device 54 of FIG. 10, an adhesive 55 is provided between the die stage 44 and the insulating member 47. In such a case shown in FIG. 10, the insulating member 47 is used for providing an insulating function while the adhesive 55 is used for the purpose of adhesion. Accordingly, the insulating member 47 can be made of a material, such as a polyimide film, which can maintain its shape under pressure. Therefore, the above-mentioned problem which may be caused by deformation of the insulating material 47 can be eliminated.

According to the first embodiment and the variation thereof, pressure is applied by the outer lead bonding tool 53 only to the end portions of the TAB leads and corresponding portions of the respective lead frames 48a and 48b. Therefore, there is no damage or deformation to the surface of the semiconductor chip 43a or the bonding wires 49a and 49b.

Additionally, the semiconductor chip 43a is fixed to the die stage 44 with the adhesive 45, and thus the semiconductor chip 43a cannot move due to the flow of the molding resin during the transfer molding process. Further, since there is provided the insulating member 47 between the TAB leads 46a and 46b and the die stage 44, the semiconductor chip 43b can be displaced only a little when a force is applied to the semiconductor chip 43b due to the injection of the molding resin. Therefore, a short circuit caused by the displacement of the semiconductor chips 43a and 43b is prevented.

Figure 11:
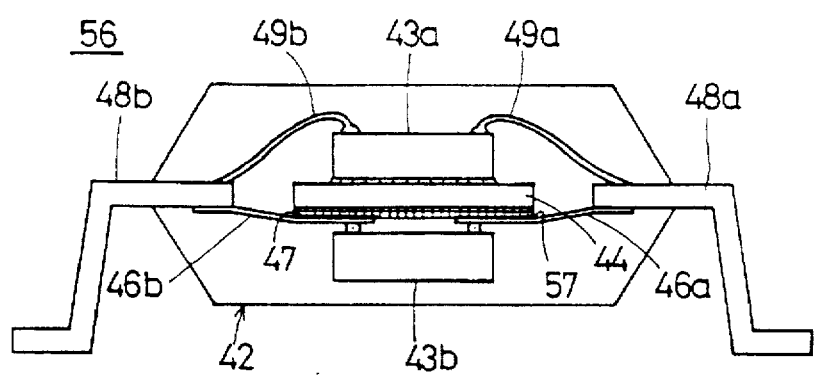
FIG. 11 is a cross sectional view of another variation of the first embodiment shown in FIG. 8.

It should be noted that when placing the TAB leads 46a and 46b on the insulating member 47 to perform the outer lead bonding, an adhesive may be used to fix the TAB leads 46a and 46b to the insulating member 47 as shown in FIG. 11. FIG. 11 is a cross sectional view of another variation of the first embodiment shown in FIG. 8. In a semiconductor device 56 of a variation of the first embodiment, an adhesive 57 is provided between the insulating member 47 and the TAB leads 46a and 46b. By fixing the TAB leads 46a and 46b to the insulating member 47, the semiconductor chip 43b is never displaced during the transfer molding process.

Figure 12A:
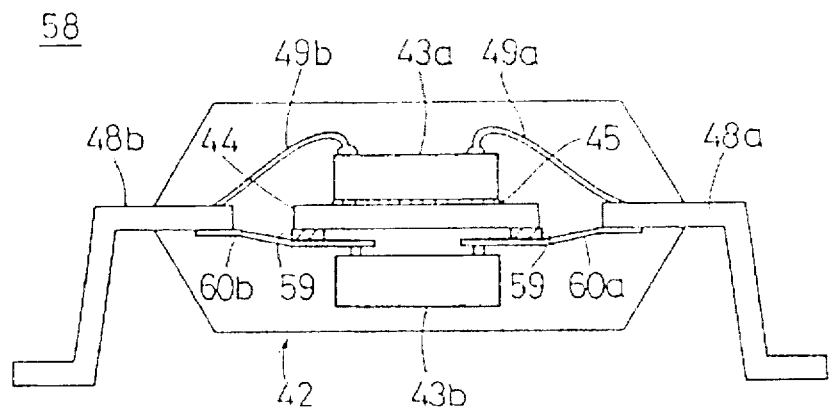
Figure 12B:
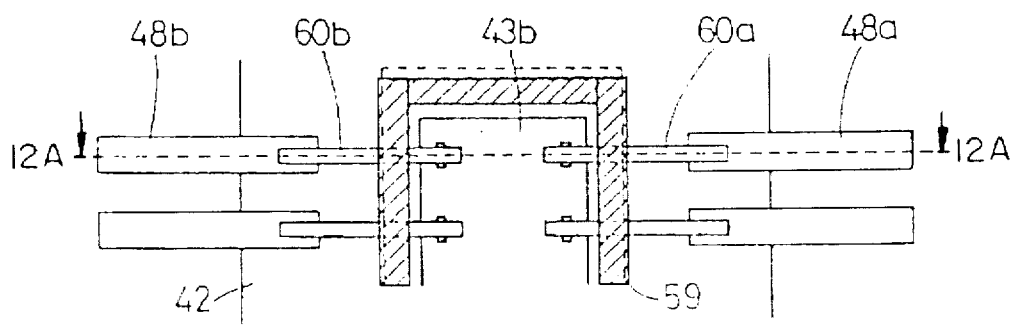

FIGS. 12A and 12B are views showing another variation of the first embodiment shown in FIG. 8, in which FIG. 12A is a cross sectional view taken along a line 12A—12A in FIG. 12A and FIG. 12B is a plan view of a part of the semiconductor device shown in FIG. 12A.

A semiconductor device 58 shown in FIG. 12A has a construction which is the same as that of the semiconductor device 41 shown in FIG. 8 except that the TAB leads 46a and 46b are replaced with TAB leads 60a and 60b. The TAB leads 60a and 60b have polyimide tape portions 59 thereon.

A description will now be given, with reference to FIG. 13, of a manufacturing process of the semiconductor device 58. First, the die stage 44 is placed on a die table 50, and the semiconductor chip 43a is mounted on the surface of the die stage 44 with an adhesive 45. After that, the semiconductor chip 43a is connected to the lead frames 48a and 48b with the bonding wires 49a and 49b.

In a separate process, the semiconductor chip 43b is attached to a TAB tape 61 by means of inner lead bonding. Unnecessary portions of the TAB tape 61 are then cut off at positions indicated by dotted lines in FIG. 13 so as to form the TAB leads 60a and 60b. The cut-off is performed so that TAB tape (polyimide tape) portions 59 remain on the TAB leads 60a and 60b.

Figure 13:
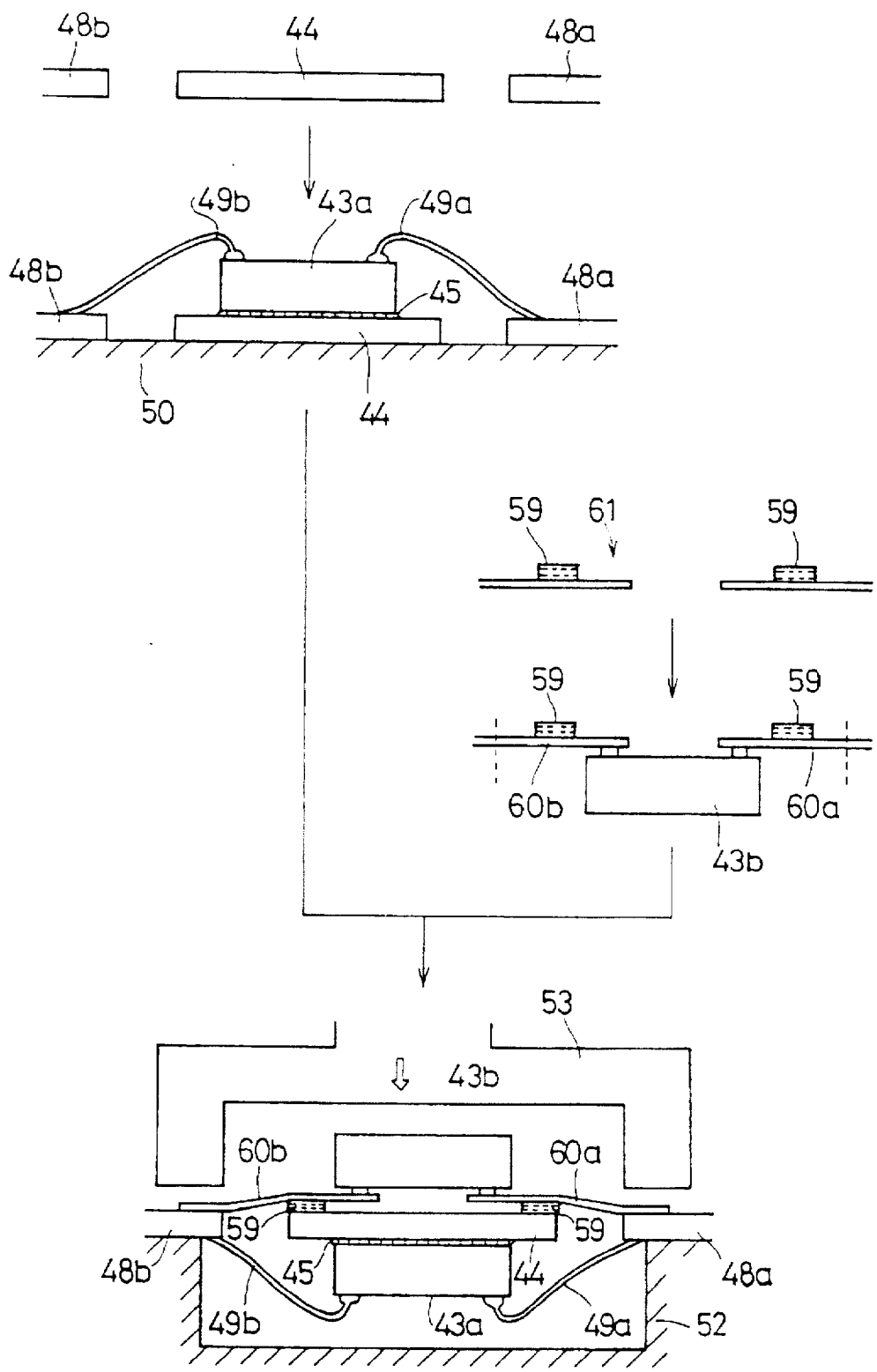
FIG. 13 is an illustration showing a manufacturing process of the semiconductor device of FIG. 12A.

After the above processes are completed, the lead frames 48a and 48b are placed on an outer lead bonding table 52 so that the semiconductor chip 43a is placed in a cavity of the outer lead bonding table 52 as shown in FIG. 13. The semiconductor chip 43b is then placed on the die stage 44 with the TAB leads 60a and 60b positioned between the semiconductor chip 43b and the die stage 44 so that the end portion of each of the TAB leads 60a and 60b is positioned on the lead frames 48a and 48b, respectively. The end portions of the TAB leads 60a and 60b are attached to the respective lead frames 48a and 48b by means of outer lead bonding by pressing the end portions of the TAB leads 46a and 46b using an outer lead bonding tool 53. Since the remaining polyimide tape portions 59 are positioned between the die stage 44 and each of the TAB leads 60a and 60b, the polyimide tape portions 59 act as the insulating member 47 of the first embodiment. Accordingly, in this variation, preparation of the independent insulating member can be omitted.

Figure 14:
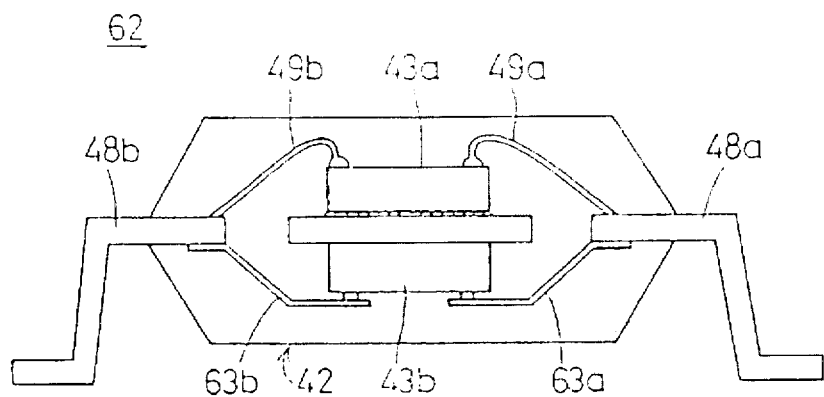
FIG. 14 is a cross sectional view of another variation of the first embodiment shown in FIG. 8.

FIG. 14 is a cross sectional view of another variation of the first embodiment shown in FIG. 8. In a semiconductor device 62 shown in FIG. 14, the semiconductor chip 43b is positioned upside down relatively to the semiconductor chip 43a. That is, the surface of the semiconductor chip 43b, on which surface circuitry is provided, faces downwardly, and TAB leads 63a and 63b are connected to the semiconductor chip 43b by means of inner lead bonding.

It should be noted that in the above-mentioned first embodiment and variations thereof, if the transfer molding is performed without connecting the semiconductor chip 43b to the lead frames 48a and 48b by means of outer lead bonding, a construction the same as a semiconductor device having a single semiconductor chip, that is the semiconductor chip 43a, can be obtained. Accordingly, there is an advantage in that lead frames common to various types of semiconductor device can be used, and thus the semiconductor device is manufactured at a reduced cost.

Figure 15A:
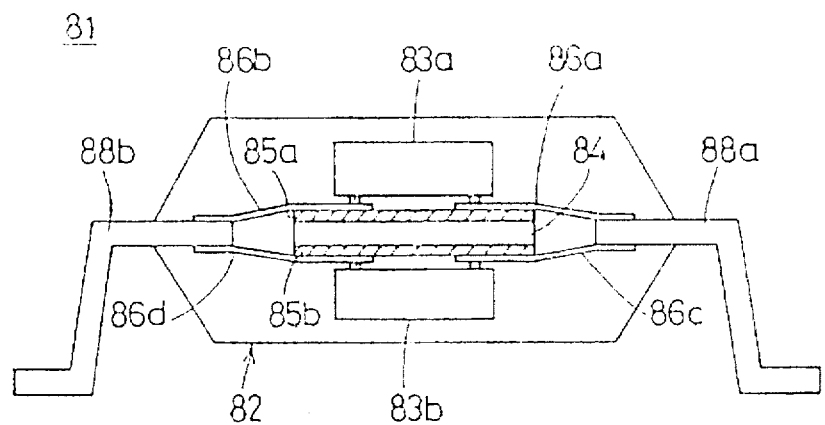
Figure 15B:
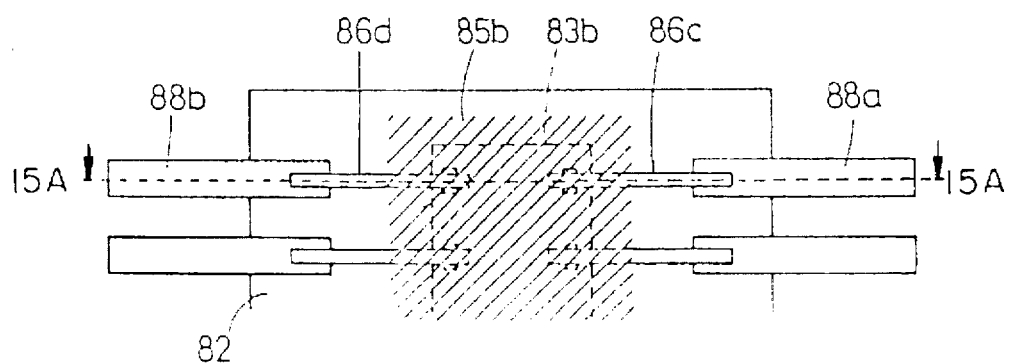

A description will now be given, with reference to FIGS. 15A and 15B, of a second embodiment of a semiconductor device according to the present invention. FIGS. 15A and 15B are views showing a second embodiment of a semiconductor device according to the present invention, in which FIG. 15A is a cross sectional view taken along a line 15A—15A in FIG. 15B and FIG. 15B is a plan view of a part of the semiconductor device shown in FIG. 15A.

A semiconductor device 81 shown in FIG. 15A comprises two semiconductor chips 83a and 83b within a single package 82. The semiconductor chip 83a is positioned on an upper surface of a die stage 84 with an insulating member 85a positioned between the die stage 84 and TAB leads 86a and 86b. The surface on which circuitry is provided faces downwardly. One end of each of the TAB leads 86a and 86b is connected to the semiconductor chip 88a by means of inner lead bonding, and the other end is connected to the lead frames 88a and 88b so that the semiconductor chip 83a can be electrically connected to external devices.

The semiconductor chip 83b is positioned under the die stage 84 with an insulating member 85b positioned between the die stage 84 and TAB leads 86c and 86d. The surface on which circuitry is provided faces upwardly. An insulating member 85b is provided between the semiconductor 83b and the die stage 84. One end of each of the TAB leads 86c and 86d is connected ti the semiconductor chip 88b by means of inner lead bonding, and the other end is connected to the lead frames 88a and 88b so that the semiconductor chip 83b can be electrically connected to external devices.

In the present embodiment, the die stage 84, provided with insulating members 85a and 85b on the opposite surface thereof, is positioned in a space between the semiconductor chip 83a and 83b. That is, the semiconductor chips 83a and 83b cannot move in the direction toward each other. Therefore, only a slight displacement of the semiconductor chips 83a and 83b may occur during the transfer molding, and thus the aforementioned short circuit can be eliminated. It should be noted that instead of using the insulating members 85a and 85b, the TAB leads 86a, 86b, 86c and 86d may be attached to the die stage 84 with an insulating adhesive.

Figure 16:
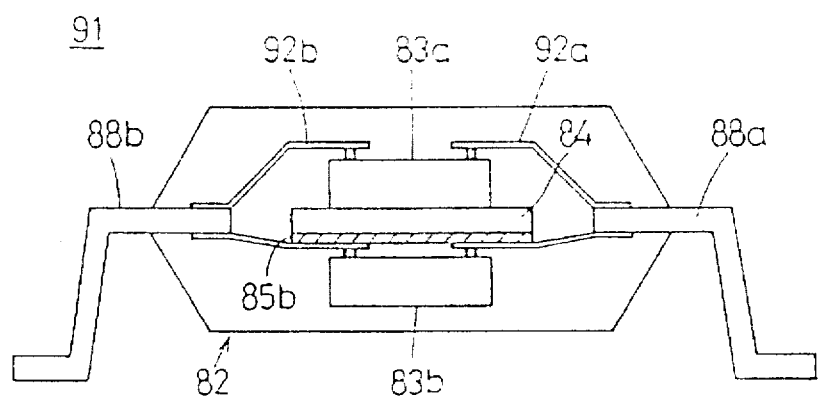
FIG. 16 is a cross sectional view of a variation of the second embodiment shown in FIG. 15A.

FIG. 16 is a cross sectional view of a variation of the second embodiment shown in FIG. 15A. In a semiconductor device 91 shown in FIG. 16, the semiconductor chip 83a is positioned on the die stage 84 with the surface on which circuitry is provided facing upwardly. First ends of TAB leads 92a and 92b, which are bent as shown in FIG. 16, are attached to the semiconductor chip 83a by means of inner lead bonding, and the other ends thereof are connected to the respective lead frames 88a and 88b. The semiconductor chip 83b is provided similarly to the second embodiment mentioned above.

Figure 17A:
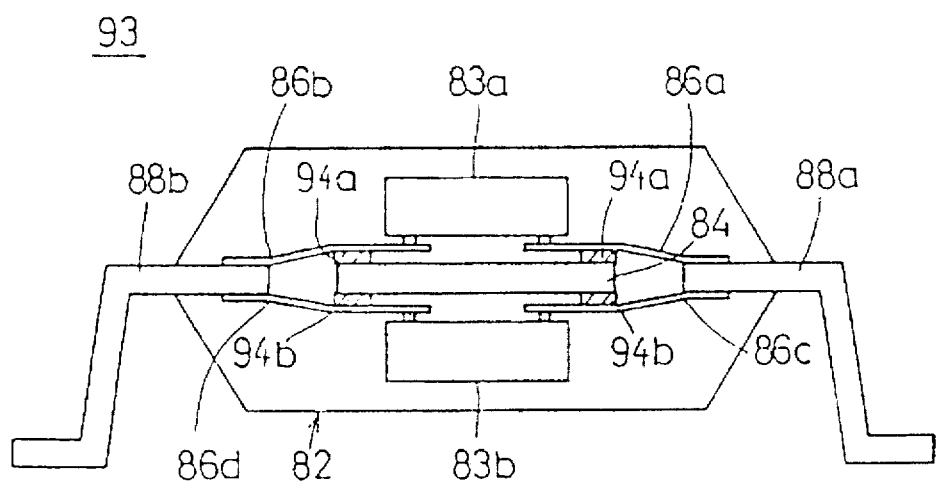
Figure 17B:
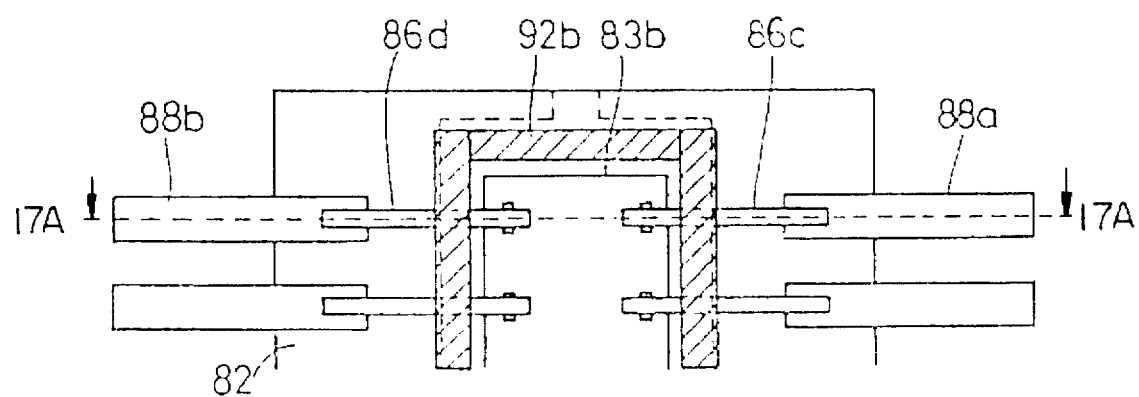

FIGS. 17A and 17B are views showing another variation of the second embodiment shown in FIG. 15A, in which FIG. 17A is a cross sectional view taken along a line 17A—17A in FIG. 17B and FIG. 17B is a plan view of a part of the semiconductor device shown in FIG. 17A.

A semiconductor device 93 shown in FIG. 17A has a construction the same as that of the semiconductor device 81 shown in FIG. 15A except that insulating members 94a and 94b are provided for the respective TAB leads 86a, 86b, 86c and 86d instead of providing the insulating members 85a and 85b. The insulating members 94a and 94b, which are portions of remaining TAB tape (polyimide tape), are formed on the respective TAB leads 86a, 86b, 86c and 86d when mounting the semiconductor chips 83a and 83b to a TAB tape.

Figure 18A:
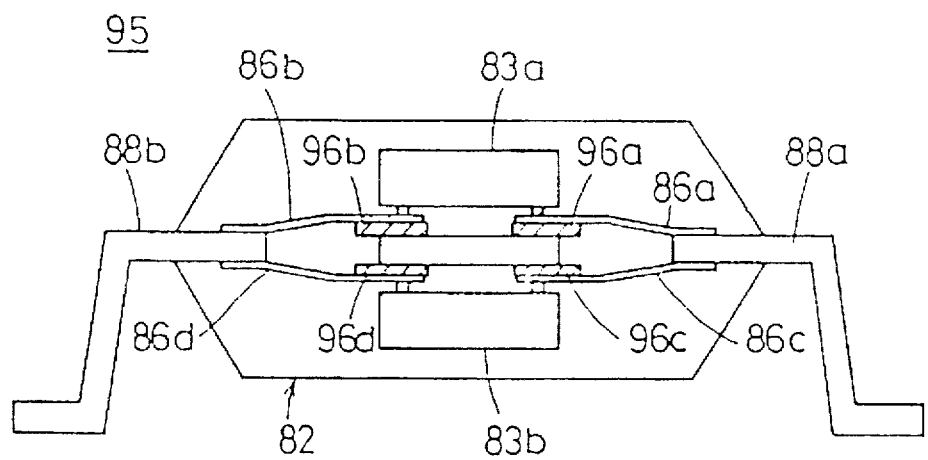
Figure 18B:
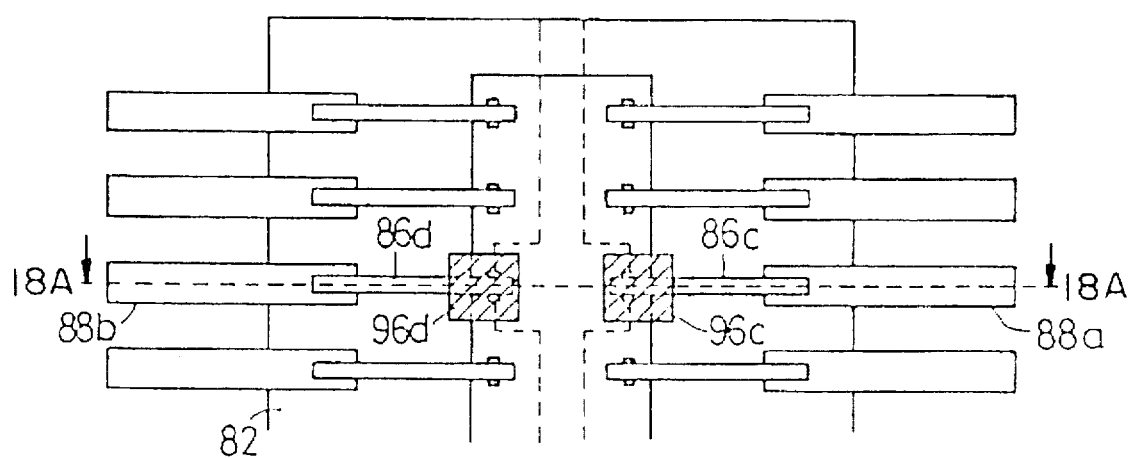

FIGS. 18A and 18B are views showing another variation of the second embodiment shown in FIG. 15A, in which FIG. 18A is a cross sectional view taken along a line 18A—18A in FIG. 18B and FIG. 18B is a plan view of a part of the semiconductor device shown in FIG. 18A. In a semiconductor device 95 shown in FIG. 18A, the insulating members 94a and 94b of the above-mentioned variation are replaced with insulating members 96a, 96b, 96c and 96d, each formed as a small strip. The single strip insulating members 96a, 96b, 96c and 96d are formed on the respective TAB leads 86a, 86b, 86c and 86d. Although FIG. 18B shows that the insulating members are provided only for the TAB leads 86c and 86d, the insulating members are provided for all such TAB leads of the semiconductor device 95.

It should be noted that in the above-mentioned second embodiment and variations thereof, there is an advantage in that the same lead frame, as that of a semiconductor device having a single semiconductor chip, can be used and thus the semiconductor device may be manufactured at a reduced cost.

Figure 19A:
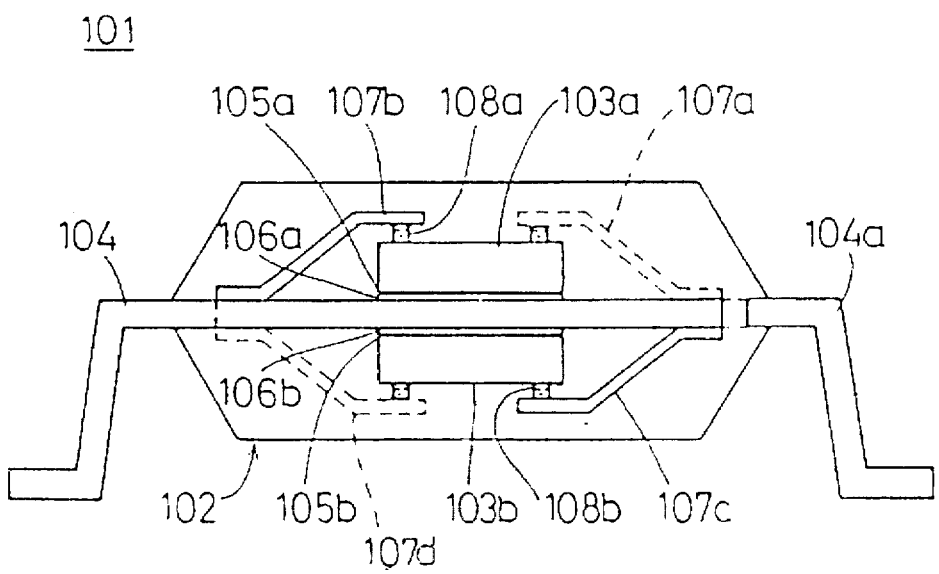
Figure 19B:
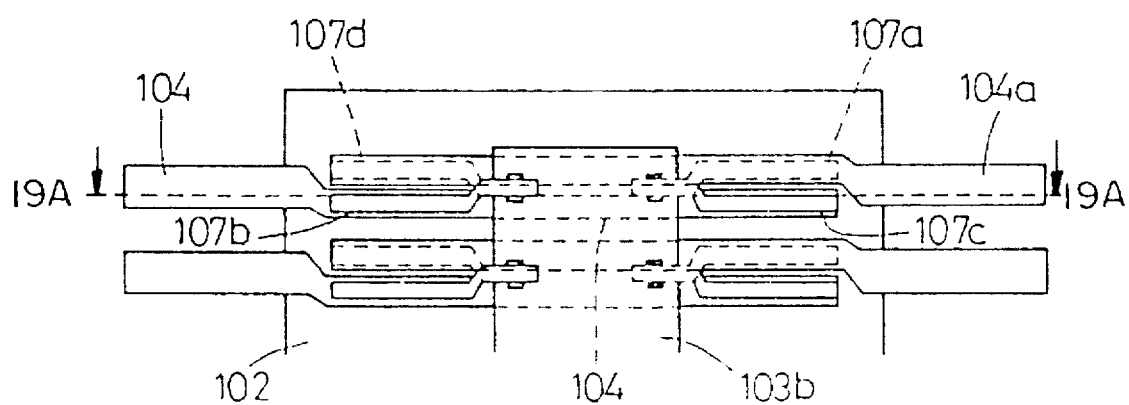

A description will now be given, with reference to FIGS. 19A and 19B, of a third embodiment of a semiconductor device according to the present invention. FIGS. 19A and 19B are views showing the third embodiment of a semiconductor device according to the present invention, in which FIG. 19A is a cross sectional view taken along a line 19A—19A in FIG. 19B and FIG. 15B is a plan view of a part of the semiconductor device shown in FIG. 19A.

A semiconductor chip 101 shown in FIG. 19A is a chip-on-chip type as shown in FIG. 19A, and comprises two semiconductor chips 103a and 103b within a single package. A lead frame 104, positioned between the semiconductor chips 103a and 103b, extends to the right side of the semiconductor chip 103a in the figure. An insulating member 105a, for example a polyimide tape, is attached to the top surface of the lead frame 104 with an adhesive 106a. The semiconductor chip 103a is placed on the insulating member 105a with the surface on which circuitry is provided facing upwardly. TAB leads 107a and 107b are attached to the semiconductor chip 103a by means of inner lead bonding.

The TAB lead 107b is connected to a portion of the lead frame 104, which portion is located on the left side of the semiconductor chip 103a, by means of outer lead bonding. The TAB lead 107a is connected to a portion of a lead frame 104a, which portion is located on the right side of the semiconductor chip 103a, by means of outer lead bonding. The lead frame 104a, also passes through the space, between the semiconductor chip 103a and semiconductor chip 103b, and extends to the left side of the semiconductor chip 103a. Accordingly, the semiconductor chip 103a can be electrically connected to external devices via the TAB leads 107a and 107b.

An insulating member 105b, for example a polyimide tape, is attached to a bottom surface of the lead frame 104 with an adhesive 106a. The semiconductor chip 103b is placed on the insulating member 105a with the surface on which circuitry is provided facing downward. TAB leads 107c and 107d are attached to the semiconductor chip 103b by means of inner lead bonding.

The TAB lead 107c is connected to a portion of the lead frame 104, which portion is located on the left side of the semiconductor chip 103b, by means of outer lead bonding. The TAB lead 107d is connected to a portion of a lead frame 104a, which portion is located on the right side of the semiconductor chip 103b, by means of outer lead bonding. The lead frame 104a also passes through the space, between the semiconductor chip 103a and semiconductor chip 103b, and extends to the left side of the semiconductor chip 103a. Accordingly, the semiconductor chip 103b can be electrically connected to external devices via the TAB leads 107c and 107d.

In order to achieve the above-mentioned construction, the lead frames 104 and 104a are formed so that the lead frames 104 and 104a do not make contact with each other as shown in FIG. 19B. The TAB leads 107a, 107b, 107c and 107d are also formed so that they correspond to the respective lead frames 104 and 104a as shown in FIG. 19B. Accordingly, the TAB lead 107c attached to a pad 108b of the semiconductor chip 103b, which pad has the same function as the pad 108a of the semiconductor chip 103a, is connected to the lead frame 104 to which the TAB lead 107b attached to the pad 108a is connected. Therefore, unlike the aforementioned conventional semiconductor device, the semiconductor chips 103a and 103b do not need to be in a mirror symmetry relationship, and thus identical semiconductor chips can be provided in a single package.

Figure 20:
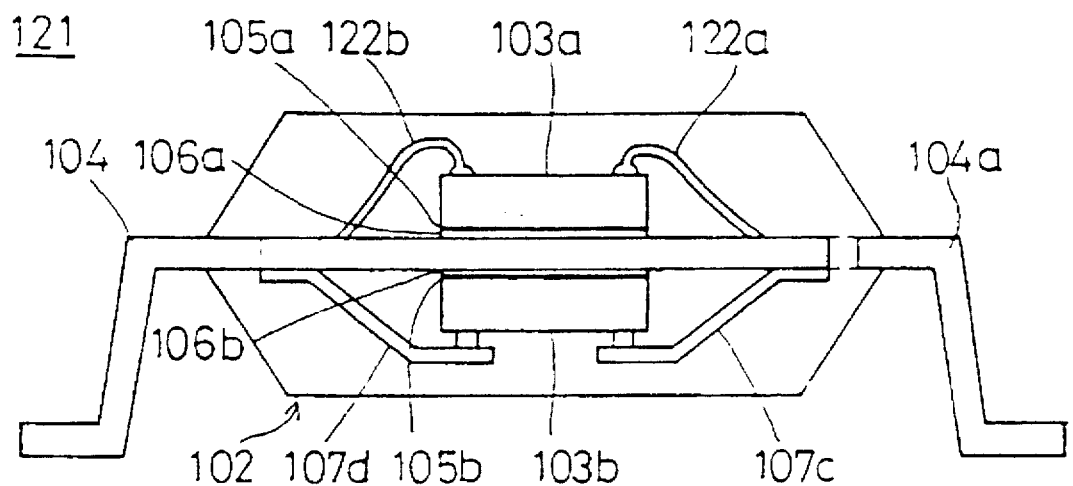
FIG. 20 is a cross sectional view of a variation of the third embodiment shown in FIG. 19A.

FIG. 20 is a cross sectional view of a variation of the third embodiment shown in FIG. 19A. In a semiconductor device 121 shown in FIG. 20, the TAB leads 107a and 107b of the semiconductor device 101 shown in FIG. 19A are replaced with bonding wires 122a and 122b, respectively. Accordingly, the present variation can be formed using only a single TAB tape, and thus a reduction in manufacturing cost can be obtained.

Figure 21:
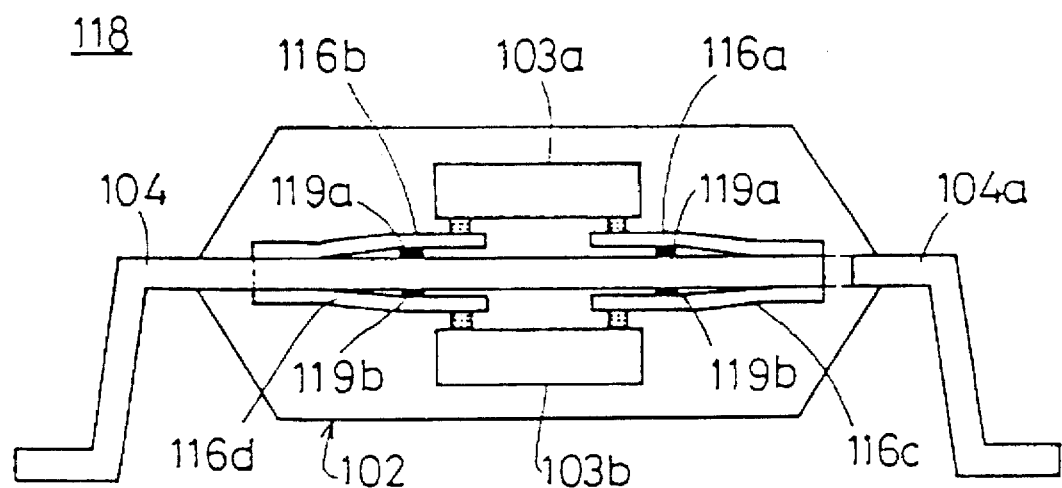
FIG. 21 is a cross sectional view of another variation of the third embodiment shown in FIG. 19A.

FIG. 21 is a cross sectional view of another variation of the third embodiment shown in FIG. 19A. In a semiconductor device 118 shown in FIG. 21, the semiconductor chip 103a is positioned with the surface on which circuitry is provided facing downwardly, and the semiconductor chip 103b is positioned with the surface on which circuitry is provided facing upwardly. The semiconductor chips 103a and 103b are connected to the lead frames 104 and 104a via TAB leads 116a, 116b, 116c and 116d, respectively. On the TAB leads 116a, 116b, 116c and 116d, there are provided TAB tape portions 119a, 119b, 119c and 119d, respectively, so that the TAB tape portions 119a, 119b, 119c and 119d are positioned between the lead frames 104 and 104a and the respective TAB leads 116a, 116b, 116c and 116d. The TAB tape portions 116a, 119b, 119c and 119d are formed, as described for the variation of the first embodiment with reference to FIG. 13, when forming the TAB leads 116a, 116b, 116c and 116d.

Figure 22A:
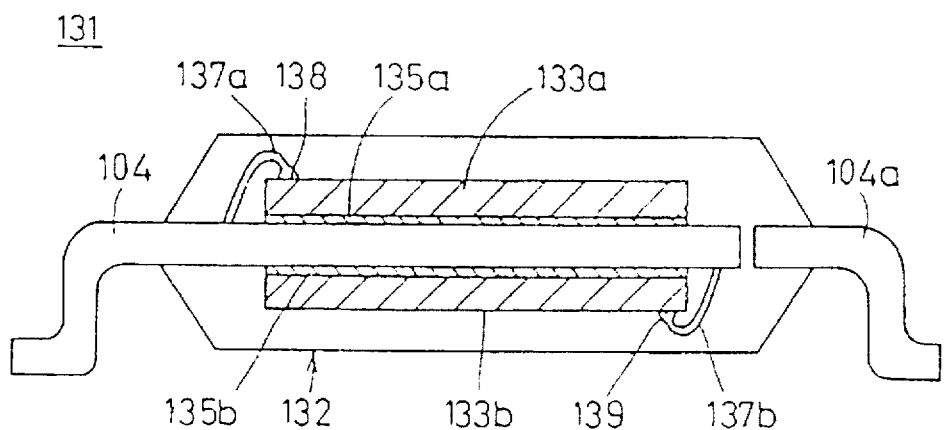
Figure 22B:
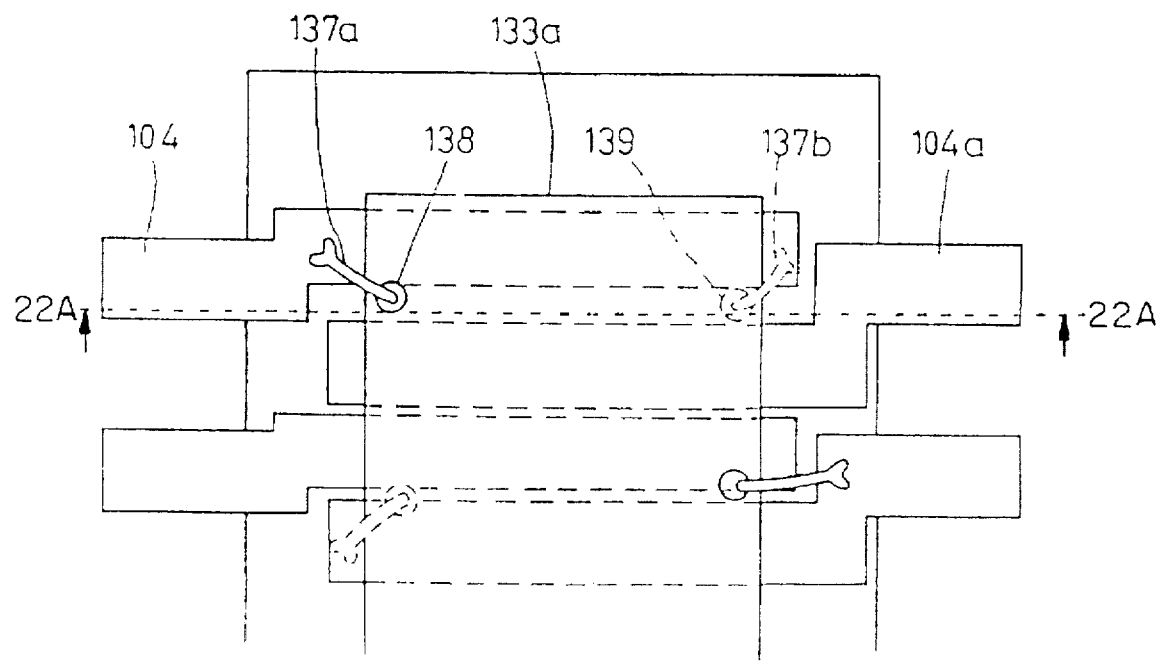

FIGS. 22A and 22B are views showing another variation of the third embodiment shown in FIG. 19A, in which FIG. 22A is a cross sectional view taken along a line 22A—22A in FIG. 22B; FIG. 22B is a plan view of a part of the semiconductor device shown in FIG. 22A.

In a semiconductor device 131 shown in FIG. 22A, semiconductor chips 133a and 133b are provided instead of the semiconductor chips 103a and 103b of the semiconductor device 101 shown in FIG. 19A. The semiconductor chips 133a and 133b are connected to the lead frames 104 and 104a via bonding wires 137a and 137b. First ends of each of the bonding wires 137a and 137b are attached to the respective pads 138a and 138b by means of wire bonding, and second ends thereof are connected to the same lead frame 104, as shown in FIG. 22B. An insulating member 135a, made of a material such as polyimide resin or SiN, is provided between the semiconductor chip 133a and the lead frames 104 and 104a. Similarly, an insulating member 135b, made of a material such as polyimide resin or SiN, is provided between the semiconductor chip 133b and the lead frames 104 and 104a.

In the present embodiment and the variations thereof, the lead frames 104 and 104a are positioned in a space between the semiconductor chip 103a and 103b or between the semiconductor chips 133a and 133b. That is, the semiconductor chips 103a and 103b or the semiconductor chips 133a and 133b cannot move toward each other. Therefore, only a slight displacement of the semiconductor chips 103a and 103b or the semiconductor chips 133a and 133b may occur during the transfer molding, and thus the aforementioned short circuit can be eliminated.

Figure 23A:
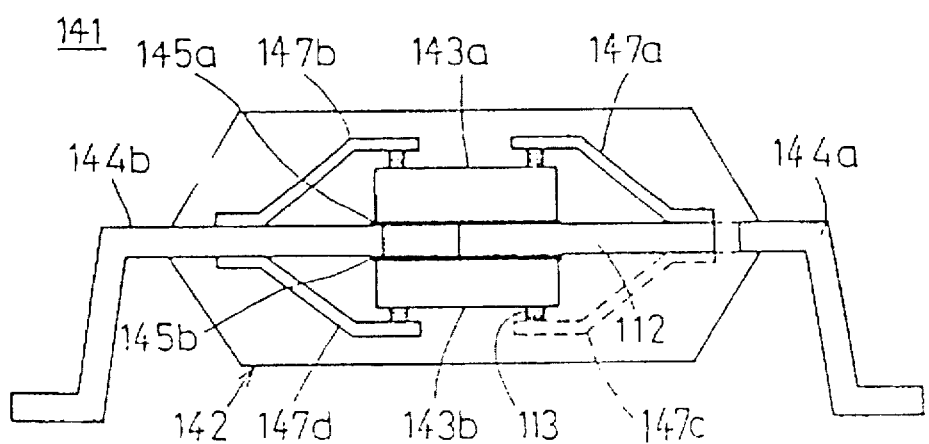
Figure 23B:
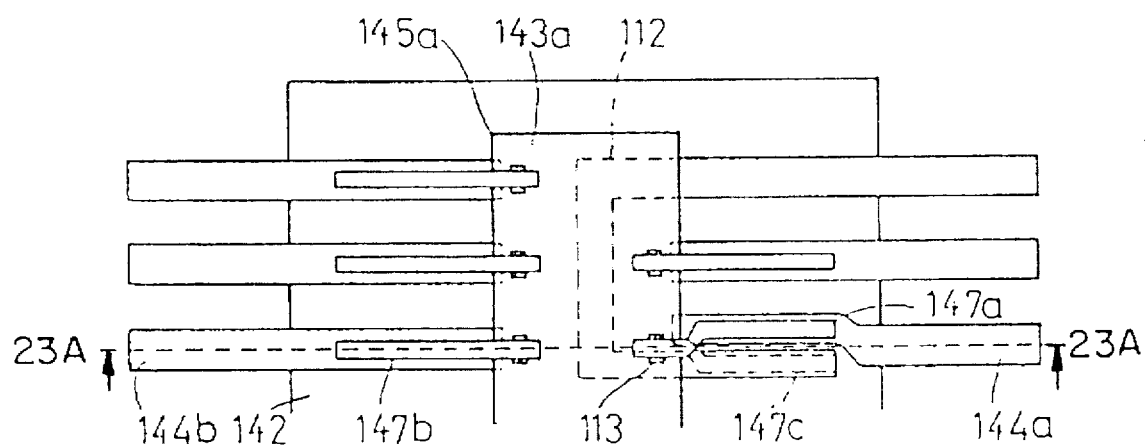

A description will now be given, with reference to FIG. 23A and 23B, of a fourth embodiment of a semiconductor device according to the present invention. FIGS. 23A and 23B are views showing the fourth embodiment of a semiconductor device according to the present invention, in which FIG. 23A is a cross sectional view taken along a line 23A—23A in FIG. 23B and FIG. 23B is a plan view of a part of the semiconductor device shown in FIG. 23A.

In a semiconductor device 141 shown in FIG. 23A, semiconductor chips 143a and 143b are provided in a single package 142. The semiconductor chip 143a is positioned with the surface on which circuitry is provided facing directed upwardly. The semiconductor chip 143b is positioned with the surface on which circuitry is provided facing downwardly. Lead frames 144a and 144b extends into a space formed between the semiconductor chips 143a and 143b. A lead frame 112 is formed in a channel shape as shown in FIG. 23B, and runs through the space between the semiconductor chips 143a and 143b.

TAB leads 147a and 147b are attached to the semiconductor chip 143a by means of inner lead bonding. TAB leads 147c and 147d are attached to the semiconductor chip 143b by means of inner lead bonding. The TAB leads 147a, 147b, 147c and 147d are connected to the respective lead frames 144a, 144b and 112. As shown in FIG. 23B, the TAB lead 147a is formed so that the TAB leads can be connected to the lead frame 144a, and the TAB lead 147c is formed so that the TAB lead 147c can be connected to the lead frame 112. An insulating member 145a is positioned between the semiconductor device 143a and the lead frames 144a, 144b and 112. An insulating member 146a is positioned between the semiconductor device 143b and the lead frames 144a, 144b and 112.

According to the above-mentioned construction of the semiconductor device 141, an end of the lead frame 112, which end extends outside a package 142, can be positioned in a desired position. Therefore, there is no restriction on positioning of the chip selector pad 113 of the semiconductor chip 143b.

Figure 24A:
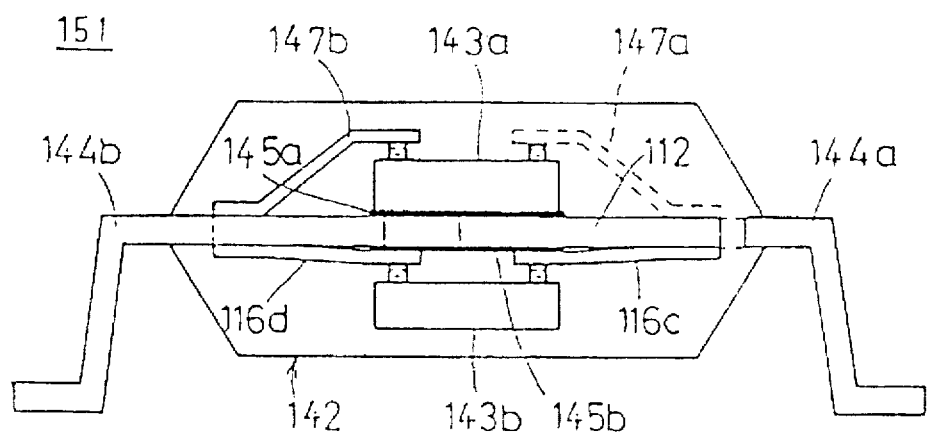
Figure 24B:
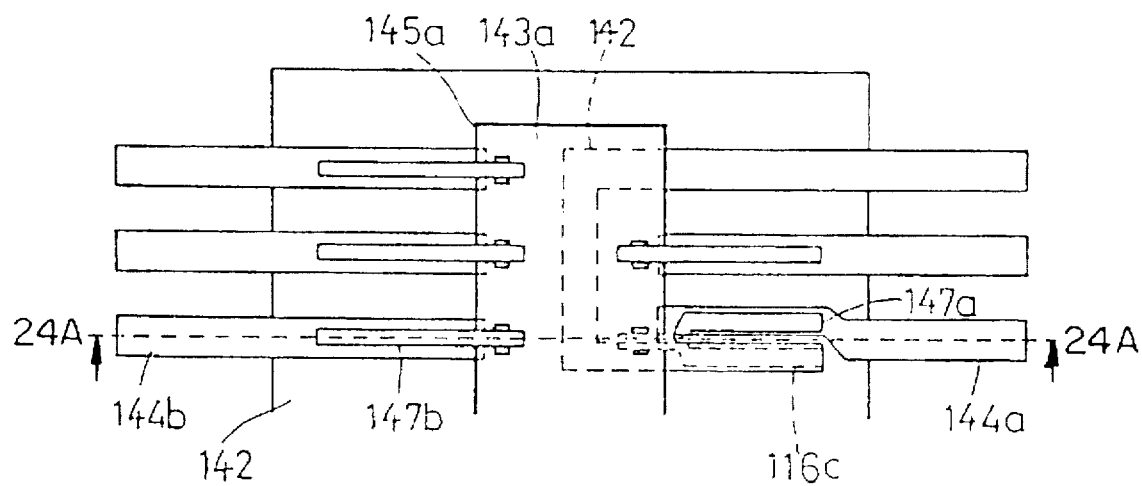

FIGS. 24A and 24B are views showing a variation of the fourth embodiment shown in FIG. 23A, in which FIG. 24A is a cross sectional view taken along a line 24A—24A in FIG. 24B; FIG. 24B is a plan view of a part of the semiconductor device shown in FIG. 24A. In a semiconductor device 151 shown in FIG. 24A, the semiconductor chip 143a is positioned with the surface on which circuitry is provided facing upwardly, which condition is the same as the semiconductor chip 143a. Accordingly, TAB leads 116a and 116b are provided instead of the TAB leads 147c and 147d.

In the present embodiment and the variations thereof, the lead frames 144a, 144b and 112 are positioned in a space between the semiconductor chips 143a and 143b. That is, the semiconductor chips 143a and 143b cannot move toward each other. Therefore, only a slight displacement of the semiconductor chips 143a and 143b may occur during the transfer molding, and thus the aforementioned short circuit can be eliminated.

It should be noted that although the embodiments and variations thereof are described as a semiconductor device having a pair of semiconductor chips, a plurality of pairs of semiconductor chips can be provided in a single package.

The invention is not limited to the specifically disclosed embodiments, and variations and modifications may be made without departing from the scope of the present invention.

What is claimed is:

1. A semiconductor device comprising:

a package having disposed therein a first semiconductor chip and a second semiconductor chip, said first semiconductor chip being displaced from said second semiconductor chip;

two lead frames disposed in and extending from said package and respectively providing electrical connections from said first semiconductor chip and said second semiconductor chip to an exterior of the package;

a die stage disposed between said first semiconductor chip and said second semiconductor chip;

a first TAB lead connecting said first semiconductor chip to the first lead frame;

a second TAB lead connecting said second semiconductor chip to the second lead frame; and first and second insulating members, said first semiconductor chip being positioned so that a surface thereof on which circuitry is provided faces a first main surface of said die stage, the first insulating member being provided between said first TAB lead and the first main surface of said die stage, and said second semiconductor chip being positioned so that a surface thereof on which circuitry is provided faces a second main surface of the die stage opposite to the first main surface thereof, the second insulating member being positioned between said second TAB lead and the second main surface of said die stage.

2. The semiconductor device as claimed in claim 9, wherein said first and second insulating members comprise corresponding first and second portions of a TAB tape, used for forming said first and second TAB leads, which remain on said first and second TAB leads, respectively, after forming said first and second TAB leads by cutting off unnecessary portions of the TAB tape.

3. A semiconductor device, comprising:

a package enclosing therein first and second semiconductor chips having respective, opposed main surfaces disposed in parallel relationship, spaced in a first direction and defining a gap therebetween, a selected main surface of each of the first and second semiconductor chips having circuitry thereon and the first and second semiconductor chips further having respective, first and second parallel sides spaced apart in a second direction, perpendicular to the first direction;

first and second lead frames, each lead frame having respective inner and outer ends, the inner ends of the first lead frames being disposed, within the package, adjacent the respective first sides of the first and second semiconductor chips and the inner ends of the second lead frames being disposed adjacent the respective second sides of the first and second semiconductor chips and the first and second lead frames extending from the respective inner ends thereof to the respective outer ends thereof, the outer ends being disposed exteriorally of the package;

a die stage disposed in the gap between the first and second semiconductor chips and having opposed main surfaces parallel to and facing, respectively, the gap defining main surfaces of the first and second semiconductor chips;

sets of TAB leads respectively associated with, and connected to, the first and second lead frames and extending therefrom, in the second direction toward the first and second semiconductor chips, each set of TAB leads comprising first TAB leads making electrical connections to the electrical circuitry on the selected main surface of the first semiconductor chip and second TAB leads, spaced in the first direction from the first TAB leads and making electrical connections to the electrical circuitry on the selected main surface of the second semiconductor chip, the selected main surface of at least one of the first and second semiconductor chips being the gap defining main surface thereof; and electrical insulation disposed between the gap defining selected main surface of the at least one of the first and second semiconductor chips and the respective, opposed main surface of the die stage and electrically insulating the inner ends of the TAB leads electrically connected to the circuitry thereon from the respective, facing main surface of the die stage.

4. A semiconductor device as recited in claim 3, wherein the respective, selected main surfaces of the first and second semiconductor chips, having circuitry thereon, are disposed in facing relationship and define the gap therebetween, the inner ends of the first and second TAB leads of each set are disposed within the gap and electrically connected to the corresponding circuitry on the selected main surfaces of the respective first and second semiconductor chips and the electrical insulation is disposed between each of the opposed main surfaces of the die stage and the respective, gap defining selected main surfaces of the first and second semiconductor chips.

5. A semiconductor device as recited in claim 4, wherein the electrical insulation comprises first and second, substantially uniform insulating layers disposed respectively on, and substantially covering, the opposed main surfaces of the die stage.

6. A semiconductor device as recited in claim 4, wherein the electrical insulation comprises insulating layer portions individually associated with, and insulating, respective inner ends of the TAB leads from the respective, facing main surface of the die stage.

7. A semiconductor device as recited in claim 3, wherein:

the respective, selected main surfaces of the first and second semiconductor chips are disposed in a common orientation in the first direction, the selected main surface of the first semiconductor chip being a gap defining surface thereof and the gap defining main surface of the second semiconductor chip, opposed to the selected main surface thereof, being disposed on the respective, facing main surface of the die stage.

* * * * *

UNITED STATES PATENT AND TRADEMARK OFFICE
CERTIFICATE OF CORRECTION

PATENT NO. : 5,724,233
DATED : March 3, 1998
INVENTOR(S) : HONDA et al.

It is certified that error appears in the above-identified patent and that said Letters Patent is hereby corrected as shown below:

TITLE PAGE: [54] Title, last line, change "PACKAG" to --PACKAGE--.

Col. 1, line 8, change "PACKAG" to --PACKAGE--;
line 48, change "a and 3b" to --3a and 3b--.

Col. 14, line 30 (Claim 2, line 1), change "claim 9" to --claim 1--.

Signed and Sealed this

Sixteenth Day of June, 1998

Attest:

BRUCE LEHMAN

Attesting Officer        Commissioner of Patents and Trademarks